(12) United States Patent
Nozu

(10) Patent No.: US 8,330,184 B2
(45) Date of Patent: Dec. 11, 2012

(54) BIDIRECTIONAL VOLTAGE-REGULATOR DIODE

(75) Inventor: Tetsuro Nozu, Tokyo (JP)

(73) Assignee: Kabushiki kaisha Toshiba, Tokyo (JP)

( * ) Notice: Subject to any disclaimer, the term of this patent is extended or adjusted under 35 U.S.C. 154(b) by 81 days.

(21) Appl. No.: 13/050,231

(22) Filed: Mar. 17, 2011

(65) Prior Publication Data
US 2012/0061792 A1 Mar. 15, 2012

(30) Foreign Application Priority Data
Sep. 15, 2010 (JP) .................... 2010-206869

(51) Int. Cl.
*H01L 29/66* (2006.01)

(52) U.S. Cl. ......... 257/110; 257/E29.031; 257/E21.196; 438/133

(58) Field of Classification Search .......... 257/107, 257/119, 122, 162, 213, 228, 327, 355, 343, 257/611, E27.054, E29.031, E29.045, E29.185, 257/E29.261, E21.196, E21.373; 438/44, 438/222, 226, 245, 269, 357, 360, 549, 555, 438/560, 561
See application file for complete search history.

(56) References Cited

U.S. PATENT DOCUMENTS

| | | | | |
|---|---|---|---|---|
| 6,396,085 B1 * | 5/2002 | Yoshida | .................... | 257/135 |
| 7,799,640 B2 * | 9/2010 | Parsey et al. | ................. | 438/268 |
| 7,943,466 B2 * | 5/2011 | Tu et al. | ........................ | 438/270 |
| 2004/0224455 A1 * | 11/2004 | Henson et al. | ............... | 438/200 |

FOREIGN PATENT DOCUMENTS

| | | |
|---|---|---|
| JP | 2004-335758 | 11/2004 |
| JP | 2007-150085 | 6/2007 |

\* cited by examiner

*Primary Examiner* — Olik Chaudhuri
*Assistant Examiner* — Su Kim
(74) *Attorney, Agent, or Firm* — Patterson & Sheridan, LLP

(57) ABSTRACT

In one embodiment, a bidirectional voltage-regulator diode includes first to fifth semiconductor layers formed on an inner surface of a first recess formed in a semiconductor substrate of an N-type in the order. The first semiconductor layer of the N-type has a first impurity concentration lower than an impurity concentration of the semiconductor substrate. The second semiconductor layer of a P-type has a second impurity concentration. The third semiconductor layer of the P-type has a third impurity concentration higher than the second impurity concentration. The fourth semiconductor layer of the P-type has a fourth impurity concentration lower than the third impurity concentration. The fifth semiconductor layer of the N-type has a fifth impurity concentration.

20 Claims, 12 Drawing Sheets

| Pav (cm$^{-3}$) | Ln (um) | W/Ln | $\alpha_T$ |
|---|---|---|---|
| 3.33E+16 | 57.3 | 0.16 | 0.99 |
| 3.33E+17 | 13.6 | 0.66 | 0.81 |
| 3.33E+18 | 2.6 | 3.46 | 0.06 |

BIDIRECTIONAL VOLTAGE-REGULATOR DIODE

CROSS REFERENCE TO RELATED APPLICATION

This application is based upon and claims the benefit of priority from the prior Japanese Patent Application No. 2010-206869, filed on Sep. 15, 2010, the entire contents of which are incorporated herein by reference.

FIELD

Embodiments described herein relate generally to a bidirectional voltage-regulator diode.

BACKGROUND

A bidirectional voltage-regulator diode has an NPN (PNP) junction and has characteristics that a breakdown occurs when a reverse bias voltage is applied to PN junctions connected in series in mutually opposite directions and a current flows in both directions at a fixed voltage (breakdown voltage).

However, the so-called snap-back effect occurs in the bidirectional voltage-regulator diode by which the breakdown voltage drops together with the current rise under the influence of transistor operation caused by the NPN junction, creating a problem that a high breakdown voltage cannot be obtained.

When the snap-back effect occurs, the breakdown voltage is not determined by the withstand voltage of a PN junction and a lower voltage than the withstand voltage of the PN junction shows up, which is caused by a current that flows when a breakdown occurs as a base current of the transistor structure.

A planar bidirectional voltage-regulator diode that reduces the current amplification factor when an N layer in the NPN structure is considered as a base layer of a bipolar transistor is known to control the transistor operation by the NPN junction.

To reduce the current amplification factor, methods such as introducing impurities to be a life time killer into the P layer and increasing impurity concentrations partially in the P layer are known. However, there are problems of more complex manufacturing processes of elements and an increased element area involved in an element structure. Thus, there is a need for a bidirectional voltage-regulator diode that can be manufactured more easily by controlling the transistor operation by the NPN junction.

BRIEF DESCRIPTION OF THE DRAWINGS

FIG. 5 is a diagram showing a base transport efficiency of the bidirectional voltage-regulator diode according to the first embodiment.

DETAILED DESCRIPTION

Figure 1A:
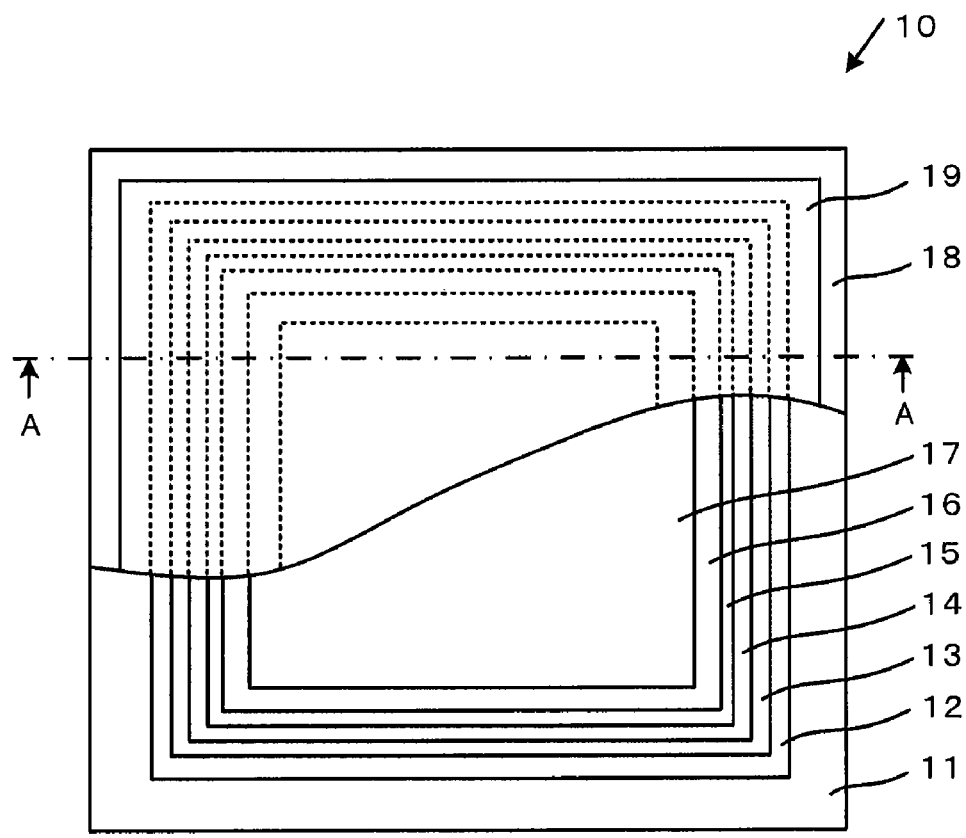
FIGS. 1A and 1B are diagrams showing a bidirectional voltage-regulator diode according to a first embodiment.

In one embodiment, a bidirectional voltage-regulator diode includes first to fifth semiconductor layers and first and second electrodes. The first semiconductor layer of a first conductive type is formed on an inner surface of a first recess formed in a first surface of a semiconductor substrate of the first conductive type so as to generate a second recess smaller than the first recess and has a first impurity concentration lower than an impurity concentration of the semiconductor substrate. The second semiconductor layer of a second conductive type is formed on the inner surface of the second recess so as to generate a third recess smaller than the second recess and has a second impurity concentration. The third semiconductor layer of the second conductive type is formed on the inner surface of the third recess so as to generate a fourth recess smaller than the third recess and has a third impurity concentration higher than the second impurity concentration. The fourth semiconductor layer of the second conductive type is formed on the inner surface of the fourth recess so as to generate a fifth recess smaller than the fourth recess and has a fourth impurity concentration lower than the third impurity concentration. The fifth semiconductor layer of the first conductive type is formed on the inner surface of the fifth recess so as to generate a sixth recess smaller than the fifth recess and has a fifth impurity concentration. The first electrode electrically is connected to the fifth semiconductor layer. The second electrode is formed on a second surface opposite to the first surface of the semiconductor substrate.

Hereinafter, further embodiments will be described with reference to the drawings. In the drawings, same reference characters denote the same or similar portions.

First Embodiment

Figure 1B:
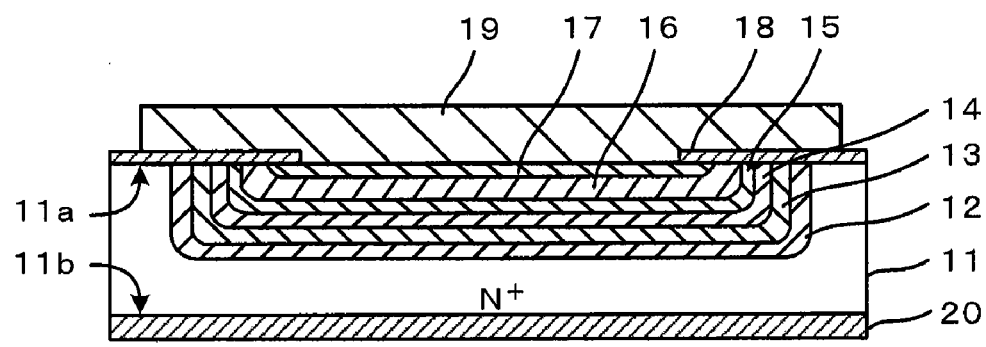
Figure 2:
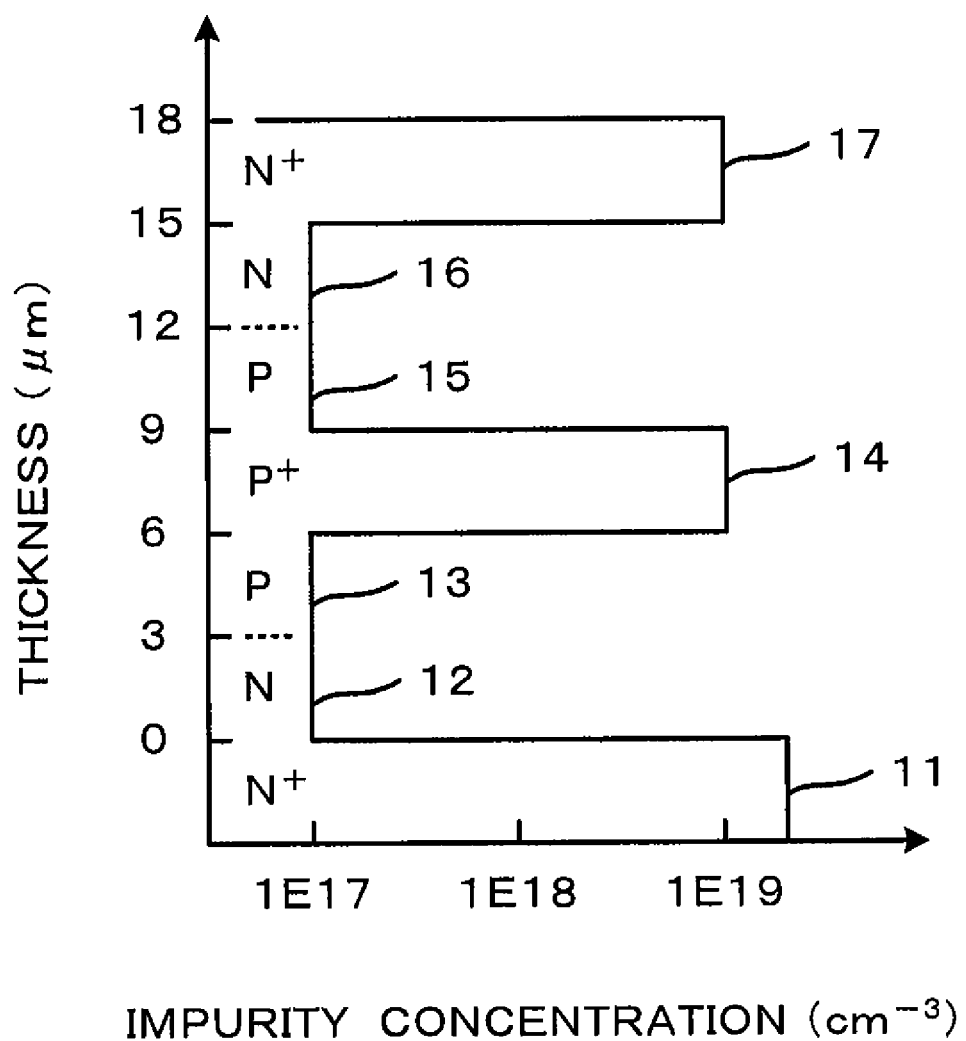
FIG. 2 is a diagram showing a distribution of an impurity concentration of the bidirectional voltage-regulator diode according to the first embodiment.

An embodiment will be described with reference to FIGS. 1A, 1B and 2. FIGS. 1A and 1B are diagrams showing a bidirectional voltage-regulator diode of the first embodiment, FIG. 1A is a plan view exposing main units by removing a portion of the bidirectional voltage-regulator diode, and FIG. 1B is a cross-sectional view viewed in an arrow direction by cutting the bidirectional voltage-regulator diode along an A-A line. FIG. 2 is a diagram showing an impurity concentration distribution of the bidirectional voltage-regulator diode.

As shown in FIGS. 1A, 1B and 2, a bidirectional voltage-regulator diode 10 of the first embodiment formed on an N-type (first conductivity type) semiconductor substrate 11. The semiconductor substrate 11 is an N$^+$-type silicon substrate whose impurity concentration is 2E19 cm$^{-3}$, for example.

On an inner surface of a first recess (not shown) formed in a first surface 11a of the semiconductor substrate 11, an N-type first semiconductor layer 12 is formed so as to generate a second recess (not shown) smaller than the first recess.

The first recess is a groove whose sectional shape and plane shape are both rectangular and has a width of 50 μm and a depth of 18 μm, for example. The first semiconductor layer 12 is an N-type silicon layer having a thickness of 3 μm and an impurity concentration (first impurity concentration) of 1E17 cm$^{-3}$, for example. Therefore, the second recess has a substantial width of 44 μm and a substantial depth of 15 μm, for example.

On the inner surface of the second recess of the first semiconductor layer 12, a P-type (second conductivity type) second semiconductor layer 13 is formed so as to generate a third recess (not shown) smaller than the second recess. The second semiconductor layer 13 is a P-type silicon layer having a thickness of 3 μm and an impurity concentration (second impurity concentration) of 1E17 cm$^{-3}$, for example. Therefore, the third recess has a substantial width of 38 μm and a substantial depth of 12 μm, for example.

On the inner surface of the third recess of the second semiconductor layer 13, a P$^+$-type third semiconductor layer 14 is formed so as to generate a fourth recess (not shown) smaller than the third recess. The third semiconductor layer 14 is a P$^+$-type silicon layer having a thickness of 3 μm and an impurity concentration (third impurity concentration) of 1E19 cm$^{-3}$, for example. Therefore, the fourth recess has a substantial width of 32 μm and a substantial depth of 9 μm, for example.

On the inner surface of the fourth recess of the third semiconductor layer 14, a P$^+$-type fourth semiconductor layer 15 is formed so as to generate a fifth recess (not shown) smaller than the fourth recess. The fourth semiconductor layer 15 is a P-type silicon layer having a thickness of 3 μm and an impurity concentration (fourth impurity concentration) of 1E17 cm$^{-3}$, for example. Therefore, the fifth recess has a substantial width of 26 μm and a substantial depth of 9 μm, for example.

On the inner surface of the fifth recess of the fourth semiconductor layer 15, an N-type fifth semiconductor layer 16 is formed so as to generate a sixth recess (not shown) smaller than the fifth recess. The fifth semiconductor layer 16 is an N-type silicon layer having a thickness of 3 μm and an impurity concentration (fifth impurity concentration) of 1E17 cm$^{-3}$, for example. Therefore, the sixth recess has a substantial width of 20 and a substantial depth of 6 μm, for example.

An N$^+$-type sixth semiconductor layer 17 is formed to fill up the sixth recess of the fifth semiconductor layer 16. The sixth semiconductor layer 17 is an N$^+$-type silicon layer having a thickness of 3 μM and an impurity concentration (sixth impurity concentration) of 1E19 cm$^{-3}$, for example.

In other words, the first to fifth semiconductor layers 12, 13, 14, 15, 16 are conformally formed on the inner surface of the respective previous recesses. Thus, the first to fifth semiconductor layers 12, 13, 14, 15, 16 have successively smaller sizes and have a box-shaped structure with an open top side in which successively smaller boxes are contained in a larger box.

Top edge surfaces of the first to fifth semiconductor layers 12, 13, 14, 15, 16 and a top surface of the sixth semiconductor layer 17 form substantially the same plane with the first surface 11a of the semiconductor substrate 11.

An insulating film 18 having an opening exposing a central portion of the sixth semiconductor layer 17 is formed on the first surface 11a of the semiconductor substrate 11, the top edge surfaces of the first to fifth semiconductor layers 12, 13, 14, 15, 16 and the top surface of the sixth semiconductor layer 17.

Further, a first electrode 19 is formed on the sixth semiconductor layer 17. A second electrode 20 is formed on a second surface 11b opposite to the first surface 11a of the semiconductor substrate 11.

An NPN junction is formed of the first semiconductor layer 12, the second to fourth semiconductor layers 13, 14, 15, and the fifth semiconductor layer 16. With the second to fourth semiconductor layers 13, 14, 15, the impurity concentration distribution of the P-type layer has a convex shape in which the concentration is high in the center and low at both sides. The semiconductor substrate 11 and the sixth semiconductor layer 17 function as a contact layer.

The bidirectional voltage-regulator diode 10 is configured to realize a high breakdown voltage by controlling an occurrence of snap-back and also to improve the withstand voltage at a diode edge.

More specifically, with an N/P/P$^+$/P/N structure in which the impurity concentration distribution of the P-type layer has a convex shape, the bidirectional voltage-regulator diode 10 is configured in such a way that the breakdown voltage is determined by the withstand voltage of the PN junction by reducing a minority carrier current in a base region of the transistor structure when a breakdown occurs.

Further, with a termination structure in which the first to fifth semiconductor layers 12, 13, 14, 15, 16 is surrounded by the N$^+$-type semiconductor substrate 11, the bidirectional voltage-regulator diode 10 is configured so that the N$^+$-type semiconductor substrate 11 functions as a guard ring.

Figure 3A:
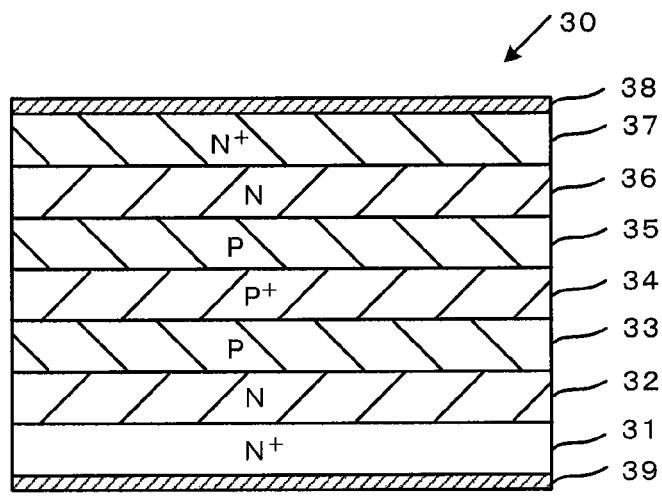
FIGS. 3A to 3B are diagrams showing current-voltage characteristics of the bidirectional voltage-regulator diode according to the first embodiment.
Figure 3B:
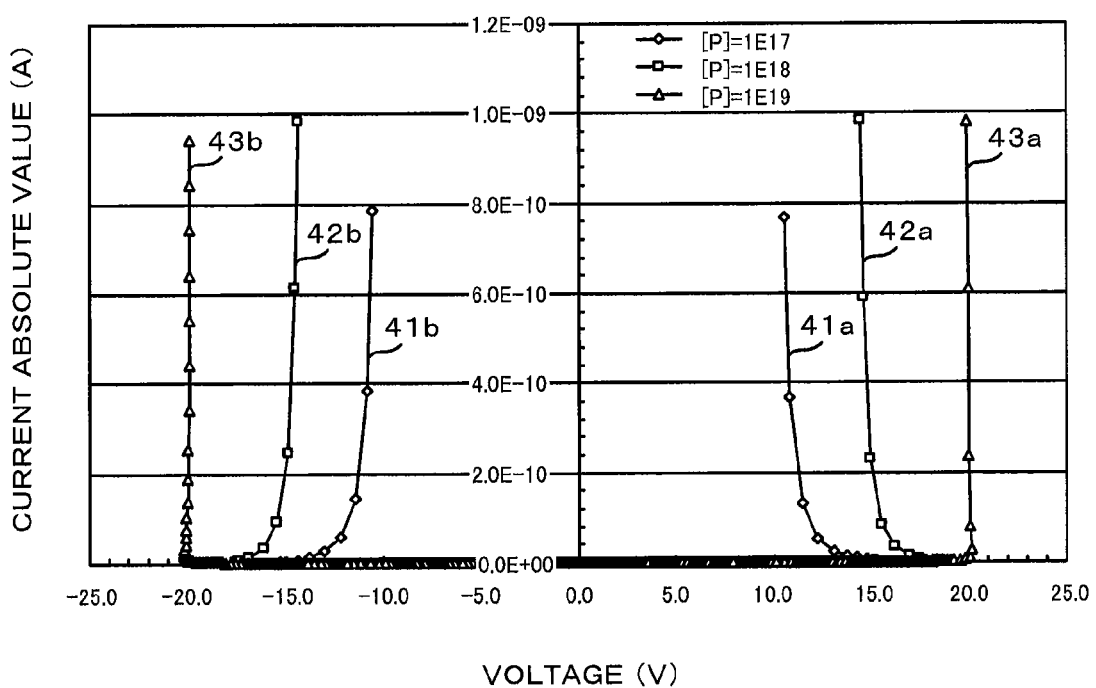

FIGS. 3A and 3B are diagrams showing voltage-current characteristics of the bidirectional voltage-regulator diode. FIG. 3A is a cross-sectional view showing a model of the bidirectional voltage-regulator diode, and FIG. 3B is a diagram showing a simulation result of the bidirectional voltage-regulator diode.

As shown in FIG. 3A, a bidirectional voltage-regulator diode 30 serving as a model has flat first to sixth semiconductor layers 32, 33, 34, 35, 36, 37 laminated on a semiconductor substrate 31. A first electrode 38 is formed on the sixth semiconductor layer 37. A second electrode 39 is formed on the semiconductor substrate 31. The first to sixth semiconductor layers 32, 33, 34, 35, 36, 37 are made flat to simplify the model.

The semiconductor substrate 31 has the same conductivity type and impurity concentration as those of the semiconductor substrate 11 shown in FIG. 2. The first to sixth semiconductor layers 32, 33, 34, 35, 36, 37 has the same conductivity type, thickness, and impurity concentration as those of the first to fifth semiconductor layers 12, 13, 14, 15, 16, 17 shown in FIG. 2.

FIG. 3B shows voltage-current characteristics of the bidirectional voltage-regulator diode 30 using the impurity concentration of the third semiconductor layer 34 as a parameter. In FIG. 3B, graphs 41a, 41b plotted with a rhomboid show voltage-current characteristics when the impurity concentration of the third semiconductor layer 34 is 1E17 cm$^{-3}$. Graphs 42a, 42b plotted with a triangle show voltage-current characteristics when the impurity concentration of the third semiconductor layer 34 is 1E18 cm$^{-3}$. Graphs 43a, 43b plotted with a square show voltage-current characteristics when the impurity concentration of the third semiconductor layer 34 is 1E19 cm$^{-3}$.

As shown in FIG. 3B, when the impurity concentration of the third semiconductor layer 34 is 1E17 cm$^{-3}$, the current starts to flow when the reverse bias voltage is 20 V (breakdown voltage Vz=20 V) and then, with an increasing current, the snap-back of up to 10 V occurs. As a result, the breakdown voltage Vz is reduced by half to about 10 V.

When the impurity concentration of the third semiconductor layer 34 is 1E18 cm$^{-3}$, the current starts to flow similarly when the reverse bias voltage is 20 V, but then, the snap-back caused with an increasing current is improved up to about 5 V. As a result, the breakdown voltage Vz is confined to about 15 V.

When the impurity concentration of the third semiconductor layer 34 is 1E19 cm$^{-3}$, the current starts to flow similarly when the reverse bias voltage is 20 V, but then, the snap-back caused with an increasing current is not observed. As a result, the breakdown voltage Vz is maintained at 20 V.

The above results show that the breakdown voltage Vz is determined by the PN junction with the first and second semiconductor layers 32, 33 or the PN junction with the fourth and fifth semiconductor layers 35, 36 and the amount of snap-back can be controlled by the impurity concentration of the third semiconductor layer 34.

Further, areas of both junctions of the NPN junction are equal and the impurity distribution is symmetrical and thus, equal values are obtained for both polarities as absolute values of the breakdown voltage Vz.

Next, a guideline for controlling the snap-back effect will be described by using a base transport efficiency $\alpha_T$ in a bipolar transistor. The base transport efficiency $\alpha_T$ is defined as a ratio of the minority carrier current passing through a collector end by undergoing recombination in the base to the minority carrier current injected into the base. The base transport efficiency $\pi_T$ will be represented as follows.

$$\alpha_T = jn(W)/jn(0) = sech(W/Ln) \quad (1)$$

where jn is the minority carrier current (density), Ln is the minority carrier diffusion length, W is the base width, and arguments 0 and W are positions at both ends.

The base transport efficiency $\alpha_T$ decreases following a hyperbolic function when the ratio (W/Ln) of the base width W and the minority carrier diffusion length Ln becomes large. As the base transport efficiency $\alpha_T$ decreases, the ratio of minority carriers injected into the base that reach the collector end decreases so that the transistor effect in a bidirectional voltage-regulator diode can be controlled.

Figure 4:
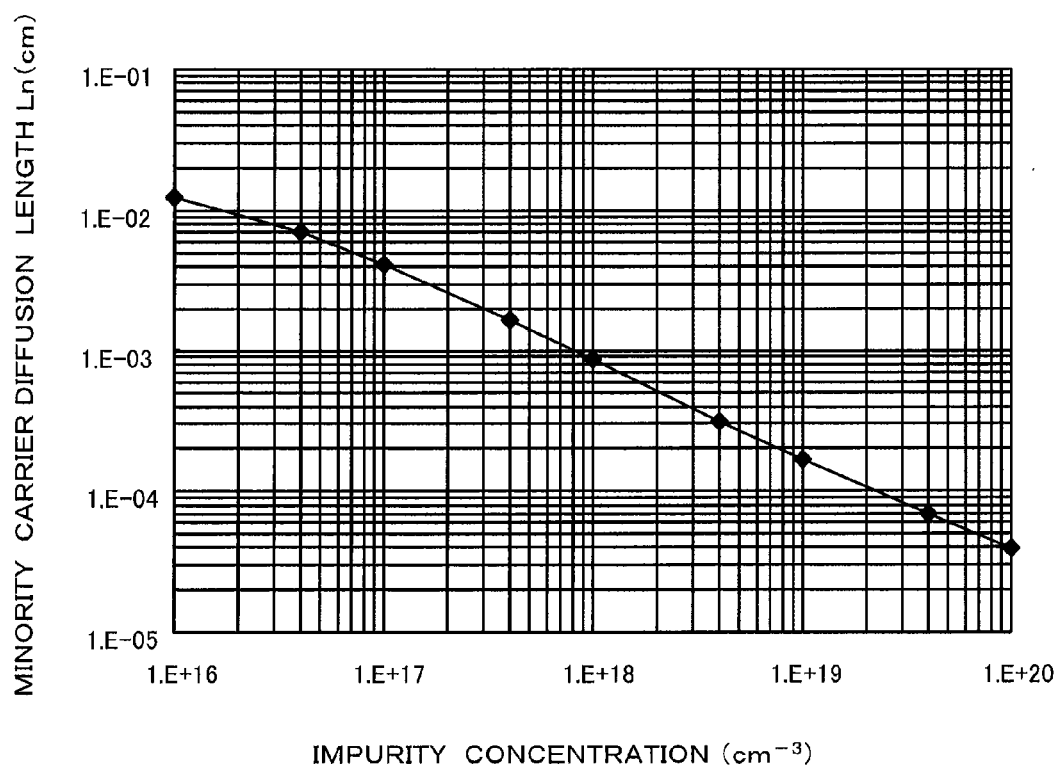
FIG. 4 is a diagram showing a relation of impurity concentration and minority carrier diffusion length of the bidirectional voltage-regulator diode according to the first embodiment.

FIG. 4 is a diagram showing a simulation result of impurity concentration dependency of the minority carrier diffusion length Ln. As shown in FIG. 4, the minority carrier diffusion length Ln depends on the impurity concentration and the minority carrier diffusion length Ln becomes shorter with an increasing impurity concentration.

FIG. 5 is a diagram showing the base transport efficiency $\alpha_T$ using the impurity concentration as parameter. As shown in FIG. 5, the base transport efficiency $\alpha_T$ decreases when the minority carrier diffusion length Ln is made shorter while the base width W is maintained constant.

The base width W is the sum of the film thickness of the second to fourth semiconductor layers 33, 34, 35. In the first embodiment, the film thickness of each of the second to fourth semiconductor layers 33, 34, 35 is 3 µM and the base width W becomes 9 µm.

A base concentration Pay is an average impurity concentration of the second to fourth semiconductor layers 33, 34, 35 by not considering the impurity concentration of the second and fourth semiconductor layers 33, 35. In the first embodiment, when the impurity concentration of the P$^+$-type third semiconductor layer 34 is 1E17 cm$^{-3}$, 1E18 cm$^{-3}$, or 1E19 cm$^{-3}$, the impurity concentration of each of the second and fourth semiconductor layers 33, 35 is set to 0 for simplicity and thus, the base concentration Pay becomes 3.3E16 cm$^{-3}$, 3.3E17 cm$^{-3}$, and 3.3E18 cm$^{-3}$, respectively.

From these results, it is appropriate to set W/Ln>1 to obtain an effect of controlling snap-back characteristics. Further, to sufficiently control snap-back characteristics, it is appropriate to set W/Ln>3.

Figure 6A:
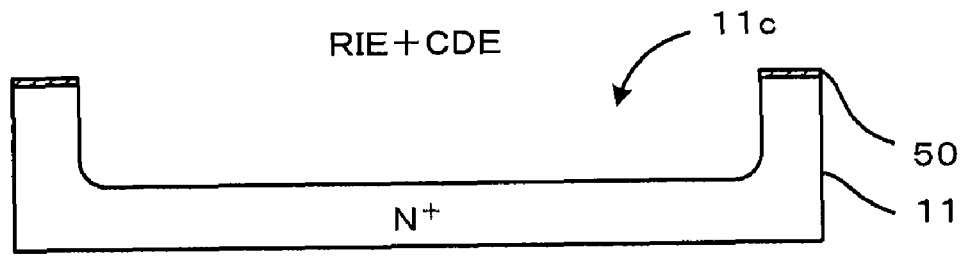
FIGS. 6A to 6C are cross-sectional views showing manufacturing steps of the bidirectional voltage-regulator diode in order according to the first embodiment.

Next, the manufacturing method of the bidirectional voltage-regulator diode 10 will be described. FIGS. 6A to 8C are sectional views showing manufacturing steps of the bidirectional voltage-regulator diode 10 in order. As shown in FIG. 6A, a silicon nitride film 50 is formed on the N$^+$-type semiconductor substrate 11 by the plasma CVD (Chemical Vapor Deposition) method, for example, to a thickness of about 50 nm.

A resist film having a rectangular opening of about 50 µm in width is formed on the silicon nitride film 50 by photolithography along a <001> direction and a <010> direction of the silicon substrate 11 and the resist film (not shown) is used as a mask to etch the silicon nitride film 50 by the RIE (Reactive Ion Etching) method using a fluorine base gas. Accordingly, the surface of the N$^+$-type silicon substrate 11 is exposed.

After the resist film being removed, the silicon nitride film 50 is used as a mask to perform anisotropic etching by the RIE method using a chlorine base/fluorine base gas, for example, and performs isotropic etching by the CDE (Chemical Dry Etching) method using a chlorine base/fluorine base gas.

Accordingly, a rectangular first recess 11c having the width of 50 µm and the depth of 18 µm is formed on the N$^+$-type silicon substrate 11. The CDE method is used to remove damage on the inner surface of the first recess 11c and to round off edges of the inner surface.

Figure 6B:
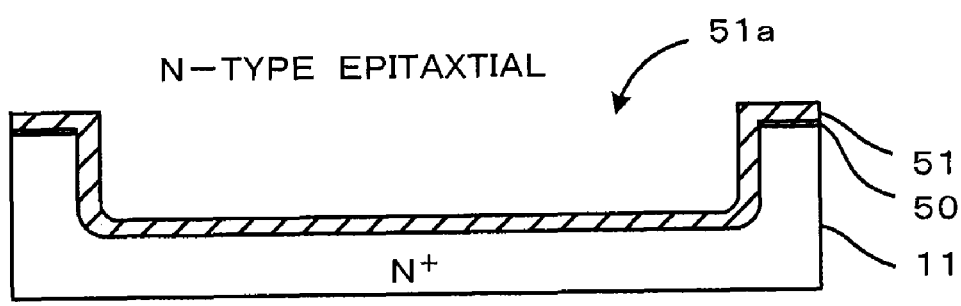

As shown in FIG. 6B, an N-type single-crystal silicon film with 3 µm thickness is formed on the inner surface of the first recess 11c by the VPE (vapor phase epitaxy) method. Accordingly, an N-type first semiconductor layer 51 is formed in such a way that a second recess 51a smaller than the first recess 11c is generated on the inner surface of the first recess 11c.

The epitaxial growth is attained at temperature 1050° C. using hydrogen (H$_2$) as a carrier gas and a mixed gas of dichlorosilane (SiH$_2$Cl$_2$) and hydrochloric acid (HCl) as a process gas. Phosphine (PH$_3$) is used as an N-type dopant gas.

The growth rate of a single-crystal silicon is normally fastest on the (100) plane and then, the (110) plane and the (111) plane. In the first embodiment, the plane direction of the N$^+$-type silicon substrate 11 is (100) and the plane direction of the sidewall of the first recess 11c is (001) and (010) and thus, the inner surfaces (bottom and sidewall) of the first recess 11c are crystallographically equivalent planes.

Therefore, the growth rate of the single-crystal silicon on the inner surface of the first recess 11c is equal and thus, the first semiconductor layer 51 with a substantially uniform thickness can be obtained.

At this point, silicon atoms adhering to the silicon nitride film 50 is not etched by HCl and thus, nucleation occurs in a portion of the silicon nitride film 50 to form a poly-silicon film.

As a result, the single-crystal silicon film on the inner surface of the first recess 11c and the poly-silicon film on the silicon nitride film 50 are continuously formed, but the epitaxial growth of the silicon-single crystal film onto the inner surface of the first recess 11c is not particularly affected.

Figure 6C:
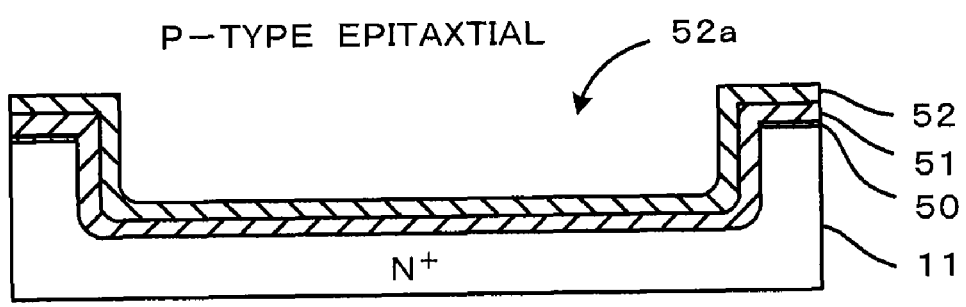

As shown in FIG. 6C, a P-type single crystal silicon film with 3 μm thickness is formed on the inner surface of the second recess 51a by, like in FIG. 6B, the VPE method. Accordingly, a P-type second semiconductor layer 52 is formed in such a way that a third recess 52a smaller than the second recess 51a is generated on the inner surface of the second recess 51a. Diborane ($B_2H_6$) is used as a P-type dopant gas.

Figure 7A:
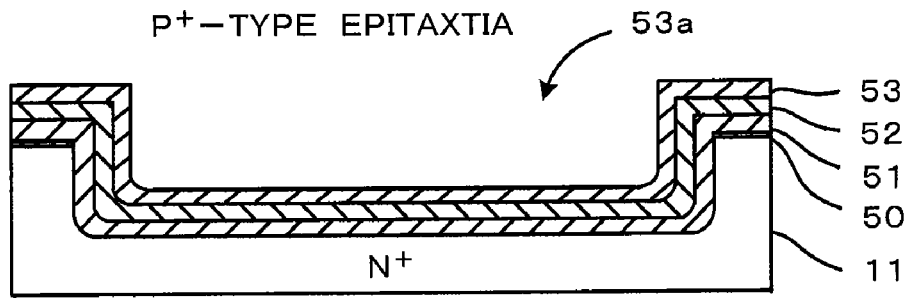
FIGS. 7A to 7C are cross-sectional views showing manufacturing steps of the bidirectional voltage-regulator diode in order according to the first embodiment.

As shown in FIG. 7A, a $P^+$-type single-crystal silicon film with 3 μm thickness is formed on the inner surface of the third recess 52a by the VPE method. Accordingly, a $P^+$-type third semiconductor layer 53 is formed in such a way that a fourth recess 53a smaller than the third recess 52a is generated on the inner surface of the third recess 52a.

Figure 7B:
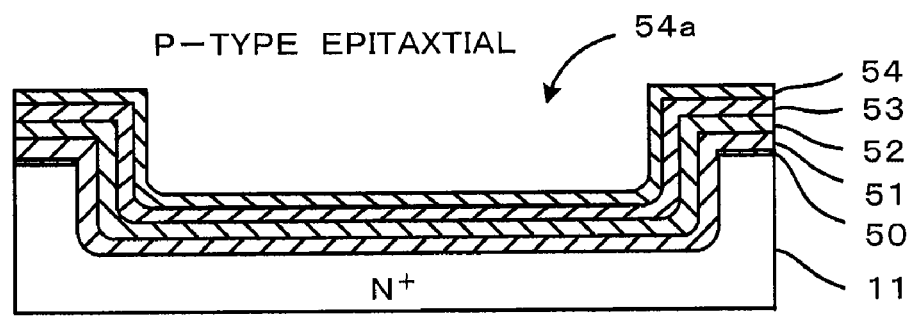

As shown in FIG. 7B, a P-type single-crystal silicon film with 3 μm thickness is formed on the inner surface of the fourth recess 53a by the VPE method. Accordingly, a P-type fourth semiconductor layer 54 is formed in such a way that a fifth recess 54a smaller than the fourth recess 53a is generated on the inner surface of the fourth recess 53a.

Figure 7C:
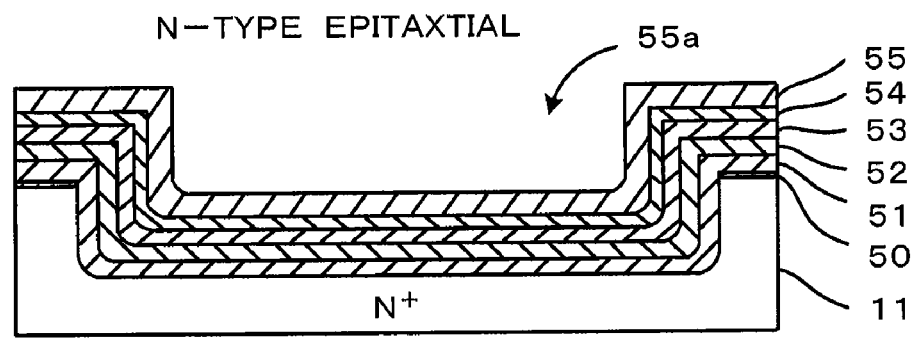

As shown in FIG. 7C, an N-type single-crystal silicon film with 3 μm thickness is formed on the inner surface of the fifth recess 54a by the chemical vapor deposition method. Accordingly, an N-type fifth semiconductor layer 55 is formed in such a way that a sixth recess 55a smaller than the fifth recess 54a is generated on the inner surface of the fifth recess 54a.

Figure 8A:
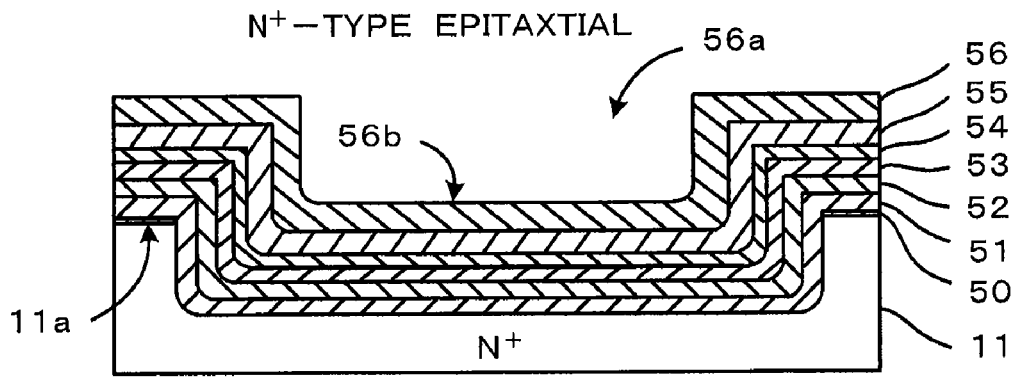
FIGS. 8A to 8C are cross-sectional views showing manufacturing steps of the bidirectional voltage-regulator diode in order according to the first embodiment.

As shown in FIG. 8A, an $N^+$-type single-crystal silicon film with 5 μm thickness is formed on the inner surface of the sixth recess 55a by the VPE method. Accordingly, an $N^+$-type sixth semiconductor layer 56 is formed in such a way that a seventh recess 56a smaller than the sixth recess 55a is generated on the inner surface of the sixth recess 55a. At this point, a bottom 56b of the sixth semiconductor layer 56 is positioned about 2 μm above the first surface 11a of the semiconductor substrate 11.

Figure 8B:
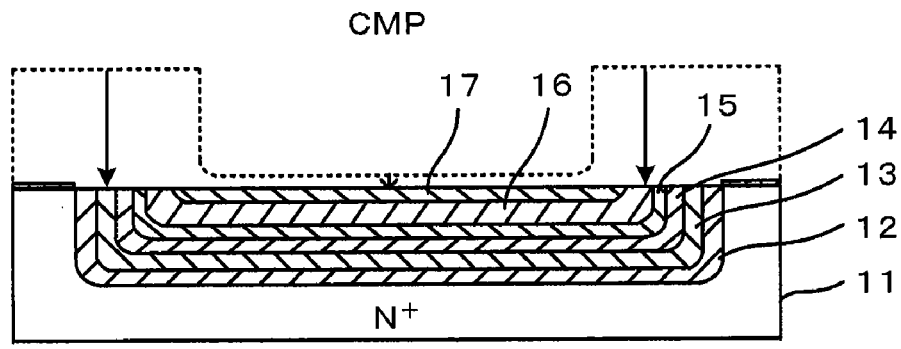

As shown in FIG. 8B, the first to sixth semiconductor layers 51, 52, 53, 54, 55, 56 is removed by the CMP (Chemical Mechanical Polishing) method, for example, until the silicon nitride film 50 is exposed, using the silicon nitride film 50 as a stopper.

Accordingly, the first to fifth semiconductor layers 12, 13, 14, 15, 16 having a structure like smaller boxes being contained in a larger box in order are formed and the sixth semiconductor layer 17 buried in the sixth recess is formed. The top edge surfaces of the first to fifth semiconductor layers 12, 13, 14, 15, 16 and the top surface of the sixth semiconductor layer 17 form substantially the same plane with the first surface 11a of the semiconductor substrate 11.

Figure 8C:
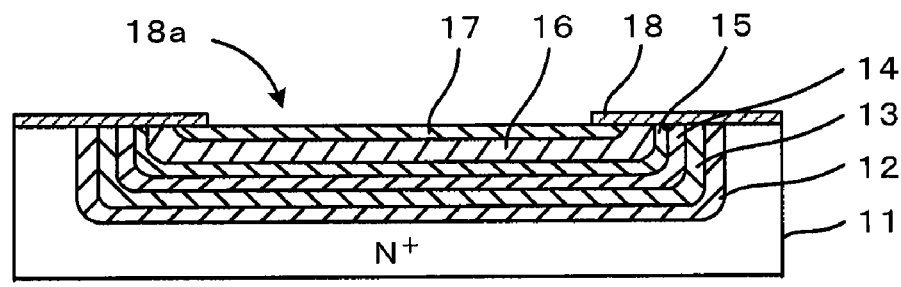

As shown in FIG. 8C, after the silicon nitride film 50 being removed, a silicon oxide film is formed on the semiconductor substrate 11, the top edge surfaces of the first to fifth semiconductor layers 12, 13, 14, 15, 16 and the sixth semiconductor layer 17 as the insulating film 18 by the CVD method, for example, a resist film having an opening is formed on the insulating film 18 by photolithography in order to expose the central portion of the sixth semiconductor layer 17, and the resist film is used as a mask to form an opening 18a that exposes the central portion of the sixth semiconductor layer 17 in the insulating film 18 by the wet etching method.

The first electrode 19 is formed on the sixth semiconductor layer 17 and the second electrode 20 is formed on the second surface 11b of the semiconductor substrate 11 to obtain the bidirectional voltage-regulator diode 10 shown in FIGS. 1A and 1B.

In the manufacturing steps of the first embodiment, performing the process of lithography is required only three times, the step to form an opening in the silicon nitride film 50 shown in FIG. 6A, the step to form the opening 18a in the insulating film 18 shown in FIG. 8C, and the patterning step of the first electrode 19. Further, performing the process of lithography is required only four times when including a case of patterning a surface passivation film.

Further, the steps to form silicon layers of the $N/P/P^+/P/N$ structure shown in FIGS. 6B to 8A can be performed continuously, switching the dopant gas type and the flow rate of the dopant gas and thus, performing the process of vapor phase epitaxy is required only one time.

The withstand voltage of the bidirectional voltage-regulator diode 10 is automatically ensured by the $N^+$-type semiconductor substrate 11 with the termination structure in which the first to fifth semiconductor layers 12, 13, 14, 15, 16 are surrounded by the $N^+$-type semiconductor substrate 11. Thus, no process is needed to form a so-called guard ring to ensure the withstand voltage.

Therefore, the bidirectional voltage-regulator diode 10 of the first embodiment has simple manufacturing processes and can be manufactured easily with a smaller number of steps.

With the $N/P/P^+/P/N$ structure in which the impurity concentration distribution of the P-type layer in an NPN junction formed of the first to fifth semiconductor layers 12, 13, 14, 15, 16 has a convex shape, the bidirectional voltage-regulator diode 10 is configured in such a way that the breakdown voltage is determined by the withstand voltage of the PN junction by reducing a minority carrier current in a base region in the transistor structure when a breakdown occurs.

Further, with the termination structure in which the first to fifth semiconductor layers 12, 13, 14, 15, 16 are surrounded by the $N^+$-type semiconductor substrate 11, the bidirectional voltage-regulator diode 10 is configured so that the $N^+$-type semiconductor substrate 11 functions as a guard ring.

As a result, a higher breakdown voltage is obtained by controlling an occurrence of snap-back and also the withstand voltage in a termination portion is improved. Therefore, a bidirectional voltage-regulator diode having a higher breakdown voltage can be obtained.

A case where the first conductivity type is the N type and the second conductivity type is the P type has been described, but the first embodiment can be carried out similarly even if the first conductivity type is the P type and the second conductivity type is the N type.

A case where the plane direction of a semiconductor substrate is (100) has been described, but other plane directions, for example, the (110) plane may be adopted. The sidewall of the first recess 11c is made a plane equivalent to the (001) plane or (−110) plane.

Further, when the plane direction of the semiconductor substrate is (111), the first embodiment can be applied. If the first recess 11c is a long stripe, for example, two sidewalls opposite along the length direction are made a plane equivalent to the (−110) plane or (−101) plane. In this case, the bottom and sidewalls of the first recess 11c do not become all equivalent planes and thus, it is desirable to equalize the growth rate of single-crystal silicon film on the two sidewalls of the first recess 11c with the widest area.

Second Embodiment

Figure 9A:
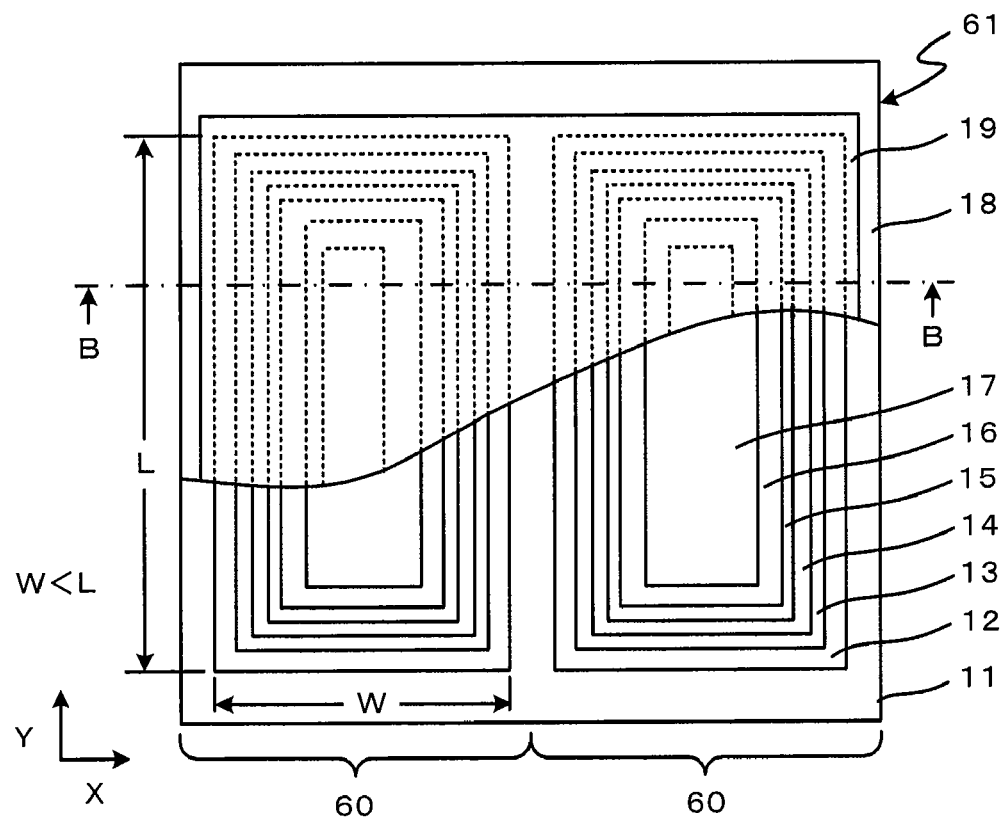
FIGS. 9A and 9B are diagrams showing a bidirectional voltage-regulator diode according to a second embodiment.
Figure 9B:
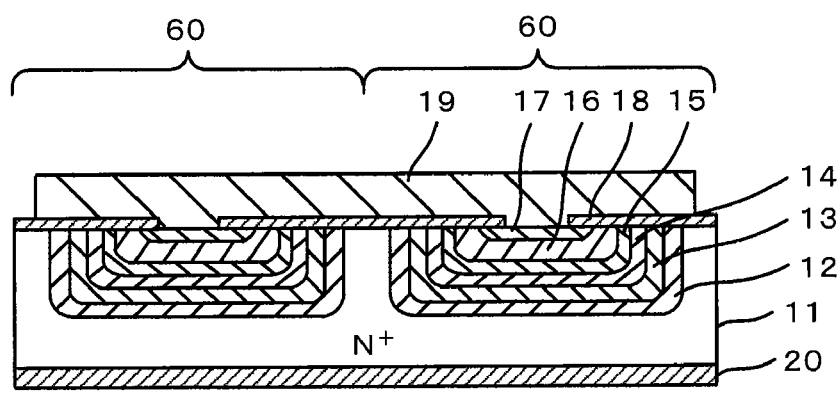

A bidirectional voltage-regulator diode of a second embodiment will be described with reference to FIGS. 9A and 9B. FIGS. 9A and 9B are diagrams showing a bidirectional voltage-regulator diode of the second embodiment, FIG. 9A is a plan view exposing main units by removing a portion of the bidirectional voltage-regulator diode, and FIG. 9B is a cross-sectional view viewed in the arrow direction by cutting the bidirectional voltage-regulator diode along a B-B line.

In the second embodiment, the same reference numerals are attached to the same structural elements as those in the first embodiment to omit a description of such structural elements and only different portions will be described. The second embodiment is different from the first embodiment in that, in a first recess whose plane shape is rectangular, the ratio of the length of a shorter side of the rectangle to the sum of thickness of the first to sixth semiconductor layers is defined.

As shown in FIGS. 9A and 9B, in a bidirectional voltage-regulator diode 60 of the second embodiment, the first recess 11c (not shown) formed in the first surface 11a of the semiconductor substrate 11 has a rectangular plane shape and the width W is smaller than the length L (W<L). The bidirectional voltage-regulator diode 60 has the same configuration as the bidirectional voltage-regulator diode 10 shown in FIGS. 1A and 1B.

The two bidirectional voltage-regulator diodes 60 are formed adjacent to each other in the X direction of the semiconductor substrate 11. The two bidirectional voltage-regulator diodes 60 are connected in parallel by the overlapping first electrode 19 to configure a bidirectional voltage-regulator diode unit 61 that functions as a bidirectional voltage-regulator diode.

The width W of the first recess 11c is set so that the ratio of the width W to the sum of thickness of the first to sixth semiconductor layers 51, 52, 53, 54, 55, 56 becomes substantially 2:1.

Accordingly, single crystal silicon layers epitaxially grown from both sidewalls of the first recess 11c can be joined in the central portion of the first recess 11c so that the thickness of the sixth semiconductor layer 56 epitaxially grown last can be reduced to a necessary minimum.

That is, if the width W of the first recess 11c is large and the thickness of the epitaxially grown first to sixth semiconductor layers 51, 52, 53, 54, 55, 56 is thin, the bottom 56b of the sixth semiconductor layer 56 after the epitaxial growth may be positioned below the first surface 11a of the semiconductor substrate 11.

Then, the bottom 56b of the sixth semiconductor layer 56 is not polished in the CMP process shown in FIG. 8B and remains as a depression, which hinders the formation of the first electrode 19 due to a difference in level. Further, flatness may not be sufficiently guaranteed in the CMP process.

To solve these problems, a sufficient thickness (5 μm) of the sixth semiconductor layer 56 epitaxially grown last is ensured in the first embodiment. However, the epitaxial growth time becomes longer, which could cause impurities of the first to fifth semiconductor layers 51, 52, 53, 54, 55 to thermally diffuse, leading to deviation of the impurity distribution from design values.

Next, the manufacturing method of the bidirectional voltage-regulator diode unit 61 of the second embodiment will be described. The manufacturing method of the bidirectional voltage-regulator diode 60 is basically the same as the manufacturing method of the bidirectional voltage-regulator diode 10 as shown in FIGS. 6A to 8C. The manufacturing method of the bidirectional voltage-regulator diode 60 is different in that the plane shape of the first recess 11c is rectangular and the ratio of the width W of the first recess 11c to the sum of thickness of the first to sixth semiconductor layers 51, 52, 53, 54, 55, 56 is set to substantially 2:1.

Figure 10A:
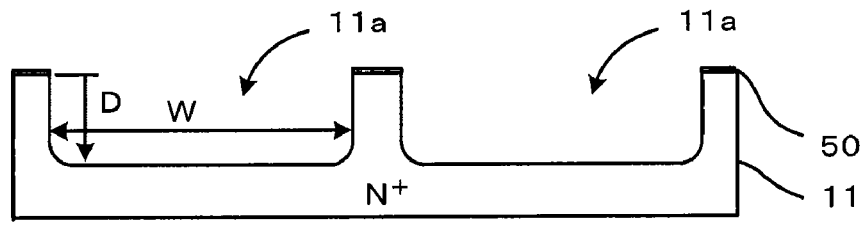
FIGS. 10A to 10C are cross-sectional views showing manufacturing steps of the bidirectional voltage-regulator diode in order according to the second embodiment.
Figure 10B:
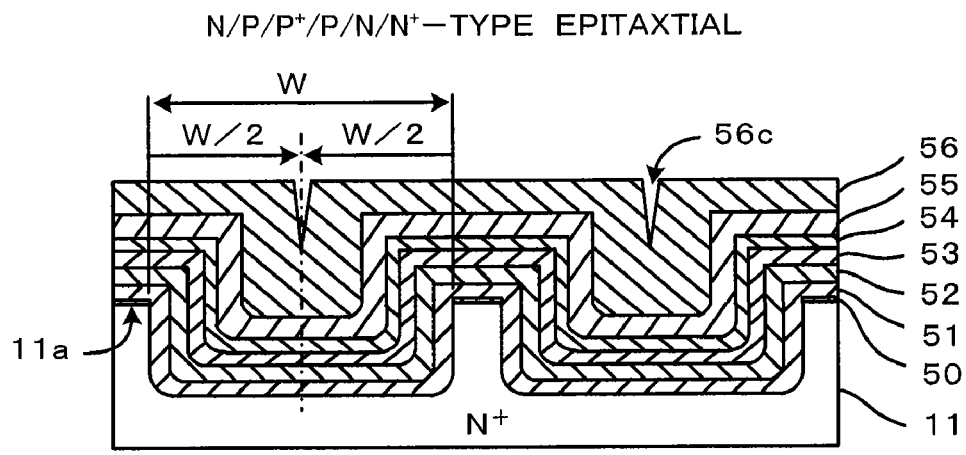

As shown in FIG. 10A, the first recesses 11a in a rectangular shape having the width W of about 32 μm and the depth D of about 17 μm are formed adjacent to each other in the semiconductor substrate 11. Next, As shown in FIG. 10B, the first to sixth semiconductor layers 51, 52, 53, 54, 55, 56 are formed continuously by the VPE method.

The thickness of each of the first to fifth semiconductor layers 51, 52, 53, 54, 55 is 3 μm and thus, the opening width in the sixth recess 55a becomes substantially 2 μm and the depth from the first surface 11a of the semiconductor substrate 11 to the bottom becomes substantially 2 μm.

As a result, when the last sixth semiconductor layer 56 is formed about 1 μm, the silicon layers grown from both sidewalls of the sixth recess 55a are joined and the surface of the sixth semiconductor layer 56 becomes flat. That is, the seventh recess 56a shown in FIG. 8A is not generated.

However, a gap 56c may be generated because silicon layers grown from both sidewalls are not joined. Nevertheless, the tip of the gap 56c is positioned above the first surface 11a of the semiconductor substrate 11 and thus, the manufacturing process is not hindered.

Figure 10C:
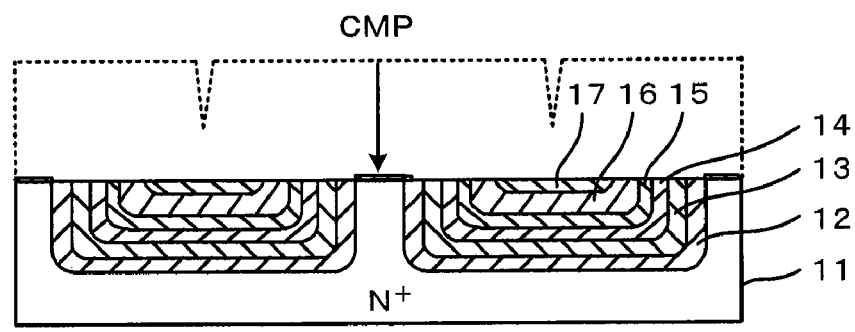

As shown in FIG. 10C, the first to sixth semiconductor layers 51, 52, 53, 54, 55, 56 are removed by the CMP method until the silicon nitride film 50 is exposed. At this point, the region where the silicon nitride film 50 remains increases than the case shown in FIG. 8C and thus, flatness of the surface can be improved.

As described above, the bidirectional voltage-regulator diode 60 of the second embodiment has the rectangular first recess 11c formed in the semiconductor substrate 11 with the ratio of the width W to the sum of thickness of the first to sixth semiconductor layers 51, 52, 53, 54, 55, 56 set to substantially 2:1.

As a result, the thickness of the sixth semiconductor layer 56 epitaxially grown last can be reduced to a necessary minimum, there is an advantage to shorten the time for epitaxial growth and to reduce manufacturing costs.

However, it is necessary to ensure the area (W×L) of the first recess 11c to satisfy the standard for current capacity of the bidirectional voltage-regulator diode 60. Therefore, it is necessary to increase the length L of the first recess 11c correspondingly for the reduced width W of the first recess 11c.

If the length L becomes too long, the bidirectional voltage-regulator diode 60 may be turned around in the length direction. Or, like in the second embodiment, a plurality of bidirectional voltage-regulator diodes may be connected in parallel to form a bidirectional voltage-regulator diode unit.

A case where the bidirectional voltage-regulator diode unit 61 has the two bidirectional voltage-regulator diodes 60 is described, but the number of bidirectional voltage-regulator diodes is not limited. A bidirectional voltage-regulator diode unit may be configured by bidirectional voltage-regulator diodes arranged two-dimensionally.

Figure 11:
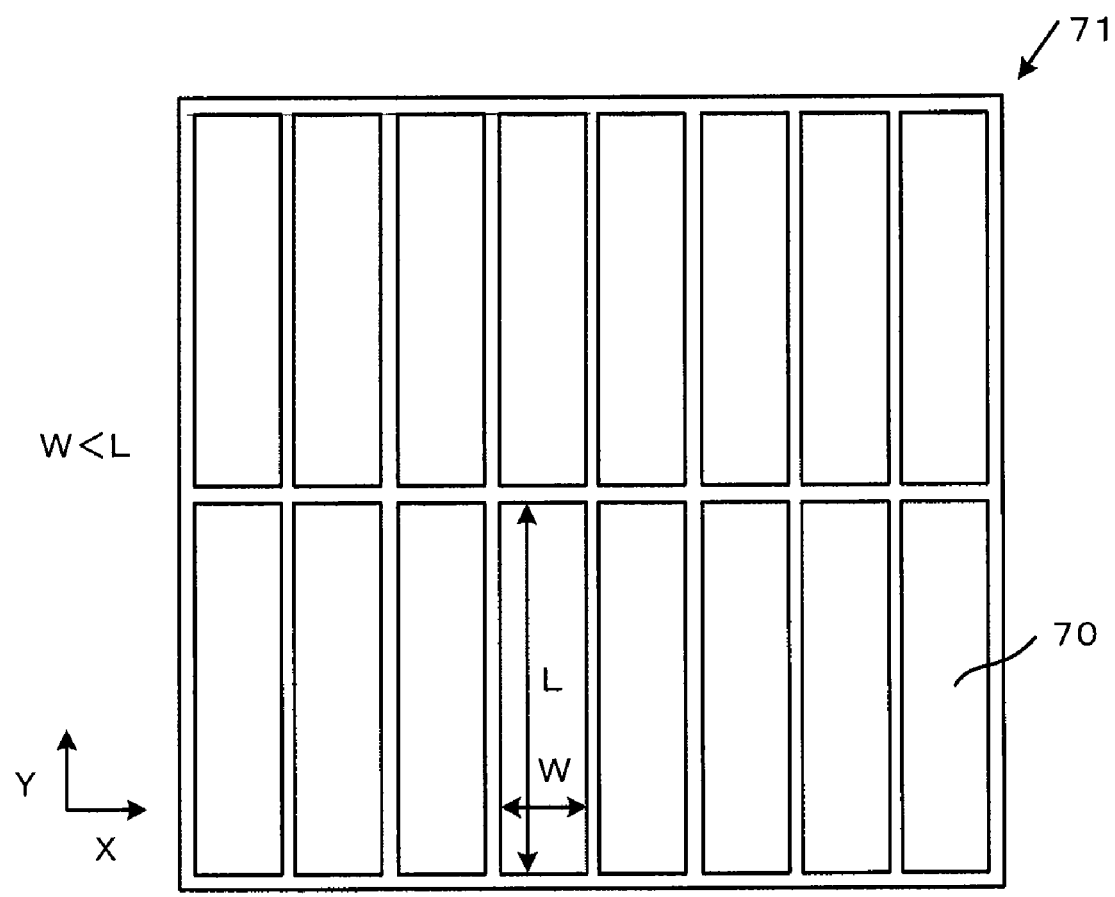
FIG. 11 is a plan view showing another bidirectional voltage-regulator diode according to the second embodiment.

FIG. 11 is a plan view showing a bidirectional voltage-regulator diode unit having multiple bidirectional voltage-regulator diodes arranged two-dimensionally. As shown in FIG. 11, a diagram showing a bidirectional voltage-regulator diode unit 71 has multiple bidirectional voltage-regulator diodes 70 being arranged like a grid in the X direction and Y direction.

Figure 12:
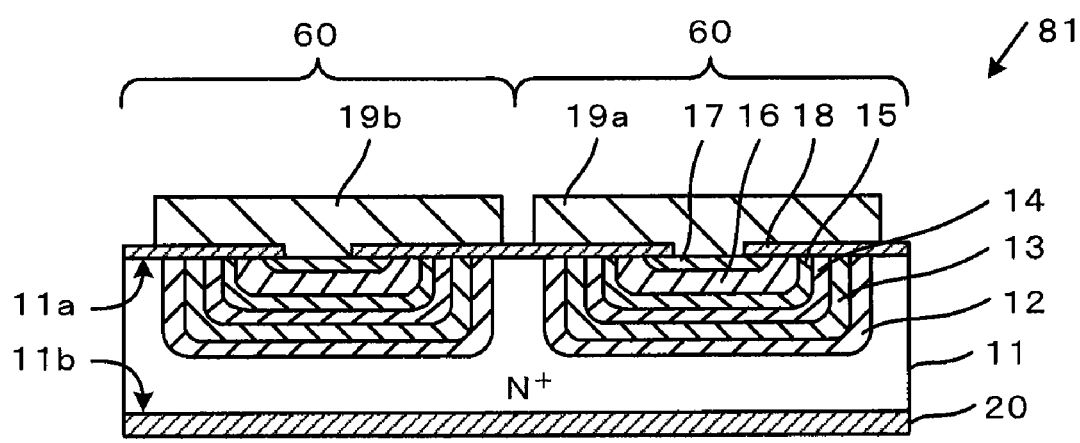
FIG. 12 is a cross-sectional view showing another bidirectional voltage-regulator diode according to the second embodiment.

A case where the two bidirectional voltage-regulator diodes 60 are connected in parallel is described, but as shown in FIG. 12, the first electrode may be divided into a first electrode 19a and a first electrode 19b while the second electrode 20 is used in common. Accordingly, a 2 in 1 type bidirectional voltage-regulator diode unit is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A bidirectional voltage-regulator diode, comprising:
a first semiconductor layer of a first conductivity type formed on an inner surface of a first recess formed in a first surface of a semiconductor substrate of the first conductivity type so as to generate a second recess smaller than the first recess and having a first impurity concentration lower than an impurity concentration of the semiconductor substrate;
a second semiconductor layer of a second conductivity type formed on the inner surface of the second recess so as to generate a third recess smaller than the second recess and having a second impurity concentration;
a third semiconductor layer of the second conductivity type formed on the inner surface of the third recess so as to generate a fourth recess smaller than the third recess and having a third impurity concentration higher than the second impurity concentration;
a fourth semiconductor layer of the second conductivity type formed on the inner surface of the fourth recess so as to generate a fifth recess smaller than the fourth recess and having a fourth impurity concentration lower than the third impurity concentration;
a fifth semiconductor layer of the first conductivity type formed on the inner surface of the fifth recess so as to generate a sixth recess smaller than the fifth recess and having a fifth impurity concentration;
a first electrode electrically connected to the fifth semiconductor layer; and
a second electrode formed on a second surface opposite to the first surface of the semiconductor substrate.

2. The bidirectional voltage-regulator diode according to claim 1, further comprising:
a sixth semiconductor layer of the first conductivity type buried in the sixth recess so that a top surface of the sixth semiconductor layer forms substantially a same plane with the semiconductor substrate and having a sixth impurity concentration higher than the fifth impurity concentration,
wherein the first recess has a rectangular top surface shape and a sum of thickness of the first to sixth semiconductor layers is substantially equal to half a length of a shorter side of the rectangular shape.

3. The bidirectional voltage-regulator diode according to claim 1, wherein a ratio of a sum of thickness of the second to fourth semiconductor layers to a minority carrier diffusion length determined by an average value of the impurity concentration of the second to fourth semiconductor layers is greater than 1.

4. The bidirectional voltage-regulator diode according to claim 3, wherein the ratio of the sum of thickness of the second to fourth semiconductor layers to the minority carrier diffusion length is greater than 3.

5. The bidirectional voltage-regulator diode according to claim 1, wherein the second impurity concentration of the second semiconductor layer and the fourth impurity concentration of the fourth semiconductor layer are substantially equal.

6. The bidirectional voltage-regulator diode according to claim 1, wherein the first electrode is formed on a sixth semiconductor layer of the first conductivity type buried in the sixth recess so that a top surface of the sixth semiconductor layer forms substantially a same plane with the semiconductor substrate and having a sixth impurity concentration higher than the fifth impurity concentration.

7. The bidirectional voltage-regulator diode according to claim 1, wherein the first impurity concentration of the first semiconductor layer and the fifth impurity concentration of the fifth semiconductor layer are substantially equal.

8. The bidirectional voltage-regulator diode according to claim 1, wherein a plane direction of the semiconductor substrate is a (100) plane or a plane equivalent to the (100) plane and each sidewall of the first recess is a plane equivalent to a (001) plane or a (010) plane.

9. The bidirectional voltage-regulator diode according to claim 1, wherein a plane direction of the semiconductor substrate is a (110) plane or a plane equivalent to the (110) plane and each sidewall of the first recess is a plane equivalent to a (001) plane or a (−110) plane.

10. A bidirectional voltage-regulator diode, comprising a plurality of semiconductor laminated bodies formed on an inner surface of a first recess formed in a first surface of a semiconductor substrate of the first conductivity type and first and second electrodes,
wherein each of the semiconductor laminated bodies including:
a first semiconductor layer of a first conductivity type formed on the inner surface of the first recess formed in the first surface of the semiconductor substrate of the first conductivity type so as to generate a second recess smaller than the first recess and having first impurity concentration lower than an impurity concentration of the semiconductor substrate;
a second semiconductor layer of a second conductivity type formed on the inner surface of the second recess so as to generate a third recess smaller than the second recess and having a second impurity concentration;
a third semiconductor layer of the second conductivity type formed on the inner surface of the third recess so as to generate a fourth recess smaller than the third recess and having a third impurity concentration higher than the second impurity concentration;
a fourth semiconductor layer of the second conductivity type formed on the inner surface of the fourth recess so as to generate a fifth recess smaller than the fourth recess and having a fourth impurity concentration lower than the third impurity concentration; and
a fifth semiconductor layer of the first conductivity type formed on the inner surface of the fifth recess so as to generate a sixth recess smaller than the fifth recess and having a sixth impurity concentration, and
wherein the first electrode is electrically connected to each of the fifth semiconductor layers of the semiconductor laminated bodies and the second electrode is formed on a second surface opposite to the first surface of the semiconductor substrate.

11. The bidirectional voltage-regulator diode according to claim 10, wherein the plurality of semiconductor laminated bodies is arranged along a first direction.

12. The bidirectional voltage-regulator diode according to claim 10, wherein the plurality of semiconductor laminated bodies is arranged in a matrix shape.

13. The bidirectional voltage-regulator diode according to claim 10, wherein the first electrode is divided into a plurality of first electrodes and each of the first electrodes is electrically connected to each of the fifth semiconductor layers of the semiconductor laminated bodies.

14. The bidirectional voltage-regulator diode according to claim 10, further comprising:
- a sixth semiconductor layer of the first conductivity type buried in the sixth recess so that a top surface of the sixth semiconductor layer forms substantially a same plane with the semiconductor substrate and having a sixth impurity concentration higher than the fifth impurity concentration,
- wherein the first recess has a rectangular top surface shape and a sum of thickness of the first to sixth semiconductor layers is substantially equal to half a length of a shorter side of the rectangular shape.

15. The bidirectional voltage-regulator diode according to claim 10, wherein a ratio of a sum of thickness of the second to fourth semiconductor layers to a minority carrier diffusion length determined by an average value of the impurity concentration of the second to fourth semiconductor layers is greater than 1.

16. The bidirectional voltage-regulator diode according to claim 15, wherein the ratio of the sum of thickness of the second to fourth semiconductor layers to the minority carrier diffusion length is greater than 3.

17. The bidirectional voltage-regulator diode according to claim 10, wherein the second impurity concentration of the second semiconductor layer and the fourth impurity concentration of the fourth semiconductor layer are substantially equal.

18. The bidirectional voltage-regulator diode according to claim 10, wherein the first electrode is formed on a sixth semiconductor layer of the first conductivity type buried in the sixth recess so that a top surface of the sixth semiconductor layer forms substantially a same plane with the semiconductor substrate and having a sixth impurity concentration higher than the fifth impurity concentration.

19. The bidirectional voltage-regulator diode according to claim 10, wherein the first impurity concentration of the first semiconductor layer and the fifth impurity concentration of the fifth semiconductor layer are substantially equal.

20. The bidirectional voltage-regulator diode according to claim 10, wherein a plane direction of the semiconductor substrate is a (100) plane or a plane equivalent to the (100) plane and each sidewall of the first recess is a plane equivalent to a (001) plane or a (010) plane.

* * * * *